US008957480B2

(12) United States Patent
Deguchi et al.

(10) Patent No.: US 8,957,480 B2
(45) Date of Patent: Feb. 17, 2015

(54) SEMICONDUCTOR DEVICE INCLUDING DUMMY TRANSISTORS WITH REDUCED OFF-LEAKAGE CURRENT

(75) Inventors: Kazuaki Deguchi, Kawasaki (JP); Yasuo Morimoto, Kawasaki (JP); Masao Ito, Kawasaki (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 14/003,225

(22) PCT Filed: Mar. 4, 2011

(86) PCT No.: PCT/JP2011/055099
§ 371 (c)(1),
(2), (4) Date: Sep. 4, 2013

(87) PCT Pub. No.: WO2012/120599
PCT Pub. Date: Sep. 13, 2012

(65) Prior Publication Data
US 2013/0334609 A1     Dec. 19, 2013

(51) Int. Cl.
*H01L 29/00* (2006.01)
*H01L 27/088* (2006.01)
*H01L 21/8234* (2006.01)
*H01L 27/02* (2006.01)

(52) U.S. Cl.
CPC ...... *H01L 27/088* (2013.01); *H01L 21/823425* (2013.01); *H01L 27/0207* (2013.01)
USPC ........................................ 257/368

(58) Field of Classification Search
None
See application file for complete search history.

(56) References Cited

U.S. PATENT DOCUMENTS

| 5,847,429 A | * | 12/1998 | Lien et al. ............... 257/355 |
| 6,107,659 A | * | 8/2000 | Onakado et al. ......... 257/318 |
| 6,504,763 B1 | * | 1/2003 | Yang et al. ............ 365/185.28 |
| 6,894,925 B1 | * | 5/2005 | Park et al. ............. 365/185.01 |

(Continued)

FOREIGN PATENT DOCUMENTS

| JP | 04-125949 A | 4/1992 |
| JP | 11-233640 A | 8/1999 |

(Continued)

OTHER PUBLICATIONS

Bianchi, R.A. et al, "Accurate Modeling of Trench Isolation Induced Mechanical Stress effects on MOSFET Electrical Performance", IEEE, IEDM Proc., 2002, pp. 117-120.

(Continued)

*Primary Examiner* — Benjamin Sandvik
(74) *Attorney, Agent, or Firm* — Miles & Stockbridge P.C.

(57) ABSTRACT

In a semiconductor device, an active region includes: a first impurity region to which a predetermined voltage is applied; second and third impurity regions forming a pair of conductive electrodes of an insulated gate field effect transistor; and at least one impurity region disposed between the first and second impurity regions. A voltage that causes electrical conduction between the second and third impurity regions is applied to a gate electrode disposed between the second and third impurity regions. All gate electrodes disposed between the first and second impurity regions are configured to be electrically connected to the first impurity region constantly. All impurity regions disposed between the first and second impurity regions are electrically isolated from the first and second impurity regions and maintained in a floating state.

8 Claims, 14 Drawing Sheets

(56) References Cited

U.S. PATENT DOCUMENTS

| | | |
|---|---|---|
| 8,067,795 B2 * | 11/2011 | Mitros et al. .................. 257/314 |
| 2003/0117168 A1 | 6/2003 | Uneme et al. |
| 2005/0274983 A1 | 12/2005 | Hayashi et al. |
| 2006/0220142 A1 | 10/2006 | Tamura |
| 2007/0026628 A1 | 2/2007 | Chung et al. |
| 2007/0296485 A1 | 12/2007 | Ashida et al. |
| 2008/0283871 A1 | 11/2008 | Hamada |
| 2008/0308855 A1 * | 12/2008 | El-Kareh et al. .............. 257/314 |
| 2010/0133625 A1 | 6/2010 | Hamada |
| 2011/0027965 A1 | 2/2011 | Tamura |

FOREIGN PATENT DOCUMENTS

| | | |
|---|---|---|
| JP | 2003-188361 A | 7/2003 |
| JP | 2005-353905 A | 12/2005 |
| JP | 2006-286889 A | 10/2006 |
| JP | 2007-036194 A | 2/2007 |
| JP | 2007-329416 A | 12/2007 |
| JP | 2008-141101 A | 6/2008 |
| JP | 2008-288268 A | 11/2008 |
| JP | 2009-267094 A | 11/2009 |
| WO | WO 2009/037808 A1 | 3/2009 |

OTHER PUBLICATIONS

Japanese Office Action issued Aug. 19, 2014, in related Japanese Patent Application No. 2013-503250.

* cited by examiner

SEMICONDUCTOR DEVICE INCLUDING DUMMY TRANSISTORS WITH REDUCED OFF-LEAKAGE CURRENT

TECHNICAL FIELD

The present invention relates to a semiconductor device having a plurality of insulated gate field effect transistors integrated therein.

BACKGROUND ART

In a semiconductor device having a plurality of MOS (Metal Oxide Semiconductor) transistors integrated therein, a shallow trench isolation (STI) is used for element isolation. Since silicon used in an active region of an MOS transistor is different in thermal expansion coefficient from an oxide film used in the STI, stress is produced in an MOS transistor provided near the STI. With the progress of reduction in size of MOS transistors, fluctuations in properties of the MOS transistors caused by this STI stress have become a problem. Specifically, the mobility increases due to the STI stress (compressive stress) in the case of a P-type MOS transistor, while the mobility decreases due to the STI stress (compressive stress) in the case of an N-type MOS transistor (refer to, for example, R. A. Bianchi et al., "Accurate Modeling of Trench Isolation Induced Mechanical Stress effects on MOSFET Electrical Performance", IEEE, IEDM Proc., pp. 117-120, 2002 (NPD 1)).

As a technique for reducing such STI strain, there has been known a technique disclosed in Japanese Patent Laying-Open No. 2008-288268 (PTD 1), for example. In a semiconductor integrated circuit described in this document, an off-state dummy transistor is disposed adjacent to an active region of an MOS transistor involved in circuit operation. As a result, stress strain to the MOS transistor is reduced.

In a technique disclosed in International Publication No. WO2009/037808 (PTD 2), a substrate contact line is disposed at an outer end of an active region that is on the outer side of the aforementioned dummy transistor, in order to further reduce the STI strain.

Japanese Patent Laying-Open No. 2006-286889 (PTD 3) discloses a technique of enhancing an operating current of an MOS transistor by actively using the STI strain. Specifically, an insulating material that provides compressive stress to an active region of a P-type MOS transistor is filled into a region adjacent to the P-type MOS transistor in a channel length direction thereof, of an STI element isolation region. An insulating material that provides tensile stress to the P-type and N-type MOS transistors is filled into the remaining element isolation region.

A technique of using the aforementioned off-state dummy transistor for element isolation of adjacent MOS transistors has been conventionally known (refer to, for example, Japanese Patent Laying-Open No. 4-125949 (PTD 4) and Japanese Patent Laying-Open No. 11-233640 (PTD 5)).

CITATION LIST

Patent Document

PTD 1: Japanese Patent Laying-Open No. 2008-288268
PTD 2: International Publication No. WO2009/037808
PTD 3: Japanese Patent Laying-Open No. 2006-286889
PTD 4: Japanese Patent Laying-Open No. 4-125949
PTD 5: Japanese Patent Laying-Open No. 11-233640

Non Patent Document

NPD 1: R. A. Bianchi et al., "Accurate Modeling of Trench Isolation Induced Mechanical Stress effects on MOSFET Electrical Performance", IEEE, IEDM Proc., pp. 117-120, 2002

SUMMARY OF INVENTION

Technical Problem

When the dummy transistor is provided to relieve the STI stress, an off-leakage current through the dummy transistor may become a problem in some cases. For example, in the case of an analog semiconductor circuit incorporated into a battery-driven mobile phone and the like, the off-leakage current that flows when the mobile phone is in a standby state becomes a problem. In the case of a flash-type AD (Analog-to-Digital) converter in which multiple comparators are disposed in parallel or a current cell-type DA (Digital-to-Analog) converter in which multiple current sources are used, multiple dummy transistors must be provided, and thus, an influence of the off-leakage current is significant.

One object of the present invention is to, in a semiconductor device provided with dummy transistors, reduce an off-leakage current flowing through the dummy transistors.

Solution to Problem

A semiconductor device according to an embodiment of the present invention includes: an active region; and a plurality of gate electrodes. The active region is formed on a main surface of a semiconductor substrate and includes a plurality of impurity regions of the same conductivity type arranged one-dimensionally. Each of the plurality of gate electrodes is provided individually in each region between two adjacent impurity regions of the plurality of impurity regions when the main surface of the semiconductor substrate is seen in a plan view. Each gate electrode forms an insulated gate field effect transistor together with the two adjacent impurity regions. The plurality of impurity regions include: a first impurity region to which a predetermined voltage is applied; second and third impurity regions forming a pair of conductive electrodes of an insulated gate field effect transistor; and at least one impurity region disposed between the first and second impurity regions. A voltage that causes electrical conduction between the second and third impurity regions is applied to a gate electrode disposed between the second and third impurity regions, of the plurality of gate electrodes. All gate electrodes disposed between the first and second impurity regions, of the plurality of gate electrodes, are configured to be electrically connected to the first impurity region constantly. By application of the predetermined voltage to all gate electrodes disposed between the first and second impurity regions, all impurity regions disposed between the first and second impurity regions, of the plurality of impurity regions, are electrically isolated from the first and second impurity regions and maintained in a floating state.

Advantageous Effects of Invention

In the semiconductor device according to the embodiment described above, a plurality of off-state dummy transistors are serially disposed between the first impurity region to which a power supply voltage or ground voltage is applied and the second impurity region involved in circuit operation. Therefore, an off-leakage current flowing through the dummy transistors can be reduced.

DESCRIPTION OF EMBODIMENTS

Figure 1:
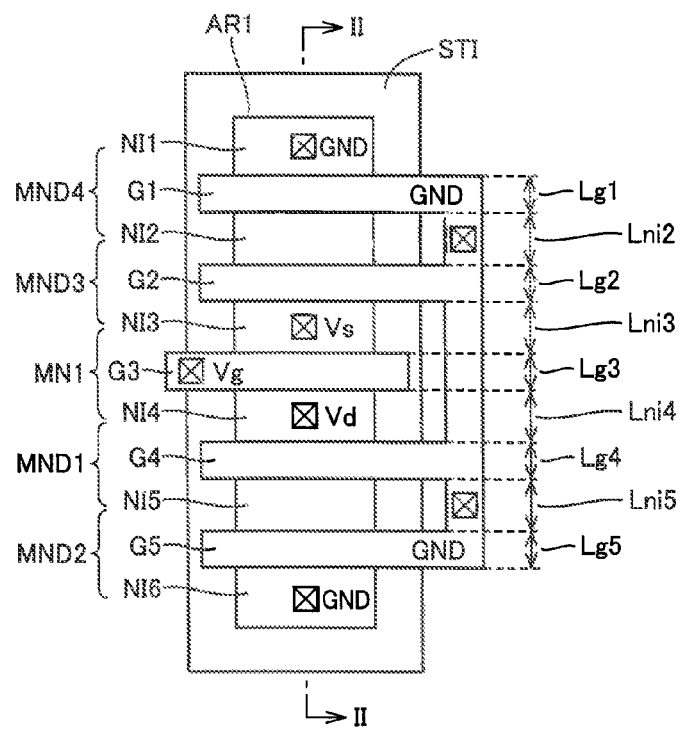
FIG. 1 is a plan view showing one layout example of an NMOS transistor according to the present invention.

Embodiments of the present invention will be described in detail hereinafter with reference to the drawings, in which the same reference characters are given to the same or corresponding portions and description thereof will not be repeated.

<First Embodiment>

[Example of Application to NMOS Transistor]

FIG. 1 is a plan view showing one layout example of an NMOS transistor according to the present invention. In a semiconductor device shown in FIG. 1, one NMOS (Negative-channel Metal Oxide Semiconductor) transistor MN 1 and four dummy transistors MND1 to MND4 are disposed on a substrate.

Figure 2:
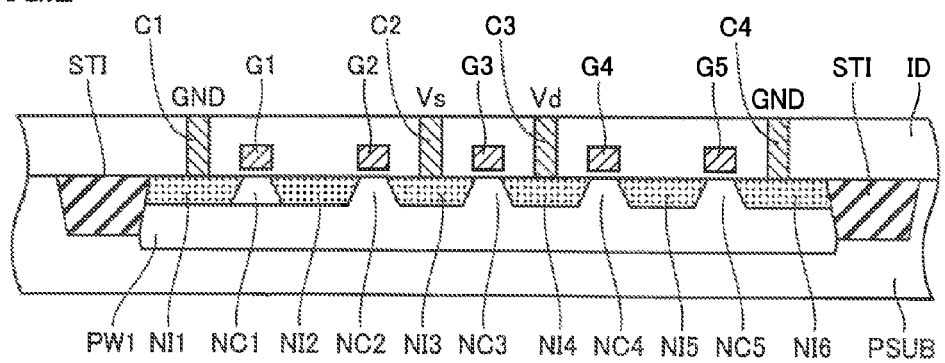
FIG. 2 is a cross-sectional view taken along a section line II-II in FIG. 1.

FIG. 2 is a cross-sectional view taken along a section line II-II in FIG. 1. Referring to FIGS. 1 and 2, the semiconductor device includes six N-type impurity regions NI1 to NI6 arranged one-dimensionally on a main surface side of a P-type semiconductor substrate PSUB, and gate electrodes G1 to G5, each of which is provided individually in each region between the adjacent impurity regions when the main surface is seen in a plan view. Impurity regions NI1 to NI6 are provided in a P-type well PW1 formed on the main surface side of P-type semiconductor substrate PSUB. Gate electrodes G1 to G5 are stacked on channel regions NC1 to NC5 of semiconductor substrate PSUB, respectively, with a gate insulating film (not shown) interposed therebetween. Gate electrodes G1 to G5 are made of, for example, polysilicon. Impurity regions NI1 to NI6 may be provided in P-type semiconductor substrate PSUB, without providing P-type well PW1 in P-type semiconductor substrate PSUB. The same is applied as well to the N-type impurity regions forming the NMOS transistor in each embodiment described below.

Impurity regions NI1 to NI6 and channel regions NC1 to NC6 as a whole are referred to as an active region AR1. A shallow trench isolation STI is formed around active region AR1. The shallow trench isolation refers to a portion formed by embedding an oxide film and the like in a shallow groove formed in a surface of a semiconductor substrate (silicon substrate) in order to isolate active regions in an insulating manner. Hereinafter, impurity regions NI1 to NI6, gate electrodes G1 to G5 and channel regions NC1 to NC5 are referred to as impurity region NI, gate electrode G and channel region NC, respectively, when they are collectively referred or when an unspecified one is indicated.

Each gate electrode G and two adjacent impurity regions NI form the NMOS transistor (more generally, insulated gate field effect transistor). In other words, two impurity regions NI adjacent to each gate electrode G form a pair of conductive electrodes of the NMOS transistor. More specific description will be given. Gate electrode G3 and adjacent impurity regions NI3 and NI4 form NMOS transistor MN1. Gate electrode G4 and adjacent impurity regions NI4 and NI5 form dummy transistor MND1. Gate electrode G5 and adjacent impurity regions NI5 and NI6 form dummy transistor MND2. Gate electrode G2 and adjacent impurity regions NI2 and NI3 form dummy transistor MND3. Gate electrode G1 and adjacent impurity regions NI1 and NI2 form dummy transistor MND4.

In NMOS transistor MN1, gate electrode G3 is connected to an upper-layer metal line (not shown) for supplying a gate voltage Vg through a contact hole formed in an interlayer insulating layer ID. Impurity region NI3 is connected to an upper-layer metal line (not shown) for supplying a source voltage Vs through a contact hole C2 formed in interlayer insulating layer ID. Impurity region NI4 is connected to an upper-layer metal line (not shown) for supplying a drain voltage Vd through a contact hole C3 formed in interlayer insulating layer ID. A current flowing through NMOS transistor MN1 changes in accordance with these gate voltage Vg, source voltage Vs and drain voltage Vd. In other words, in accordance with gate voltage Vg applied to gate electrode G3, conduction occurs between impurity regions NI3 and NI4.

In dummy transistors MND1 to MND4, gate electrodes G1, G2, G4, and G5 are formed integrally and thereby interconnected. These gate electrodes G1, G2, G4, and G5 are connected to an upper-layer metal line (not shown) for supplying a ground voltage GND through a contact hole formed in interlayer insulating layer ID. As a result, dummy transistors MND1 to MND4 are turned off. Gate electrodes G1, G2, G4, and G5 do not necessarily need to be formed integrally. Gate electrodes G1, G2, G4, and G5 may be separated from one another and formed of a polysilicon layer, and each gate electrode may be connected individually to the upper-layer metal line for supplying ground voltage GND.

Of impurity regions NI1 to NI6 arranged one-dimensionally, impurity regions NI1 and NI6 located at opposing ends are connected to the upper-layer metal line for supplying ground voltage GND through contact holes C1 and C4 formed in interlayer insulating layer ID, respectively. In other words, impurity regions NI1 and NI6 located at the opposing ends of the one-dimensional arrangement are configured to be electrically connected to gate electrodes G1, G2, G4, and G5 constantly. Ground voltage GND is applied to these impurity regions NI1 and NI6 as well as gate electrodes G1, G2, G4, and G5. Since each of impurity regions NI2 and NI5 is not connected to any upper-layer metal lines and ground voltage GND is constantly applied to the gate electrodes adjacent to both sides thereof, each of impurity regions NI2 and NI5 is maintained in a floating state.

Figure 3:
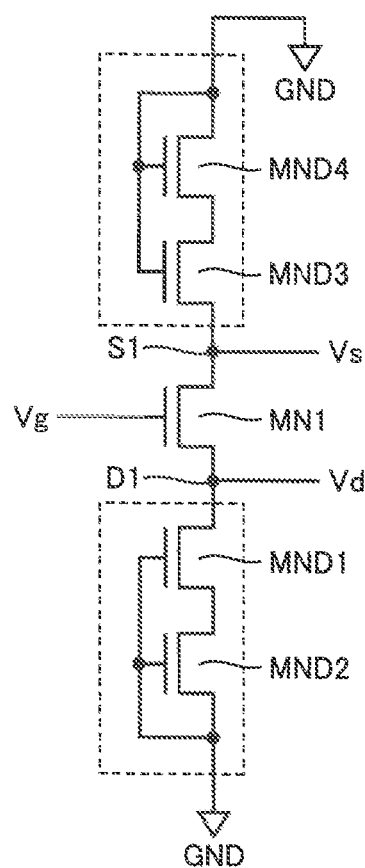
FIG. 3 is an equivalent circuit diagram corresponding to FIG. 1.

FIG. 3 is an equivalent circuit diagram corresponding to FIG. 1. In FIG. 3, transistors provided within the broken lines are dummy transistors MND1, MND2, MND3, and MND4. As shown in FIG. 3, dummy transistors MND1 and MND2 are serially connected between a drain terminal D1 (corresponding to impurity region NI4 in FIG. 1) of NMOS transistor MN1 and a ground node (corresponding to impurity region NI6 in FIG. 1) that receives ground voltage GND. Dummy transistors MND3 and MND4 are serially connected between a source terminal S1 (corresponding to impurity region NI3 in FIG. 1) of NMOS transistor MN1 and a ground node (corresponding to impurity region NI1 in FIG. 1). The gate electrodes of dummy transistors MND1, MND2, MND3, and MND4 are connected to the ground nodes.

According to the semiconductor device having the above-described configuration, a distance from gate electrode G3 of NMOS transistor MN1 to the end of active region AR1 along a gate length direction (direction of arrangement of impurity regions NI1 to NI6) can be extended by dummy transistors MND1, MND2, MND3, and MND4. As a result, an influence of the STI stress on the properties of NMOS transistor MN1 can be reduced.

Furthermore, since two dummy transistors are serially connected between the node (source S1, drain D1) set at a voltage value other than ground voltage GND and the ground node, the off-leakage current can be reduced. The number of serially-connected dummy transistors may be further increased in order to further reduce the off-leakage current. When three dummy transistors are serially connected, for example, two floating-state impurity regions are disposed between the impurity region used as NMOS transistor MN1 in FIG. 1 and the impurity region at the end to which ground voltage GND is applied. In other words, when the dummy transistors of n in number (n is an integer larger than 1) are serially connected, the floating-state impurity regions of n−1 in number are provided.

Dummy transistors MND1, MND2, MND3, and MND4 also have the effect of suppressing the shape nonuniformity caused by the manufacturing process. Referring to FIG. 1, in order to suppress the shape nonuniformity, it is desirable that gate lengths Lg1 to Lg5 of gate electrodes G1 to G5 be all equal, and it is desirable that lengths Lni2 to Lni5 of impurity regions NI2 to NI5 in the gate length direction be all equal.

[Example of Application to PMOS Transistor]

Figure 4:
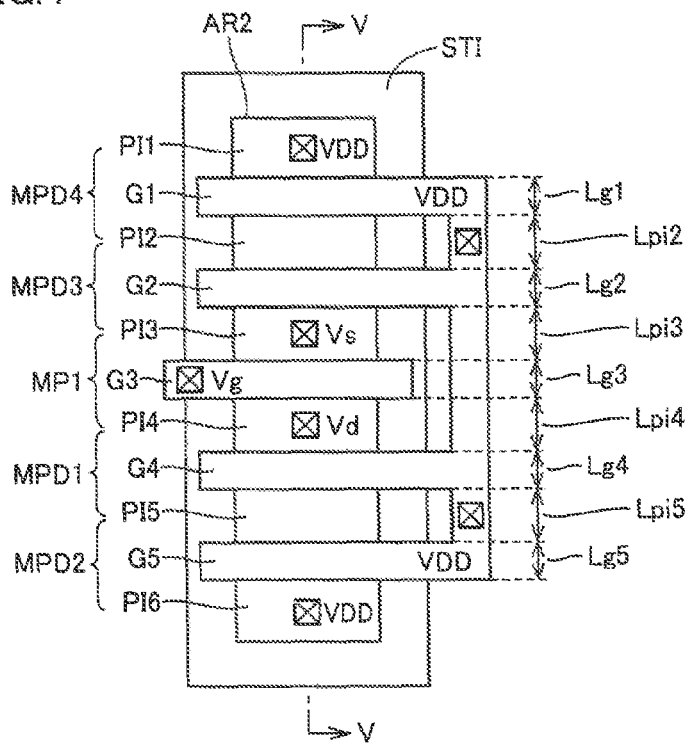
FIG. 4 is a plan view showing one layout example of a PMOS transistor according to the present invention.

FIG. 4 is a plan view showing one layout example of a PMOS transistor according to the present invention. In a semiconductor device shown in FIG. 4, one PMOS (Positive-channel Metal Oxide Semiconductor) transistor MP1 and four dummy transistors MPD1 to MPD4 are disposed on a substrate.

Figure 5:
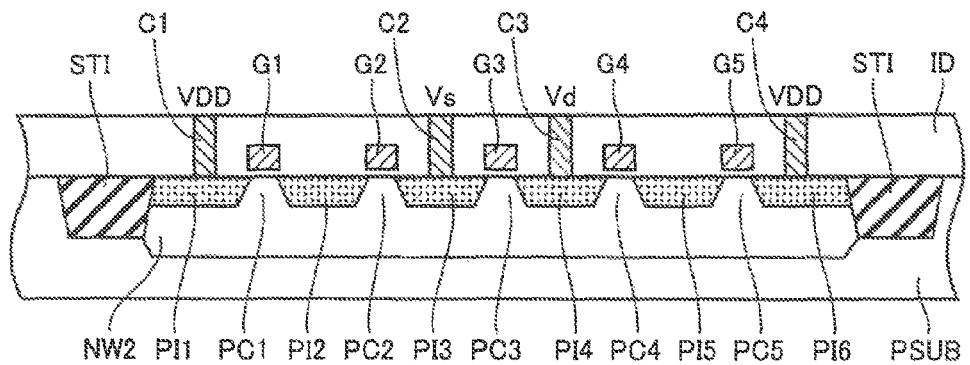
FIG. 5 is a cross-sectional view taken along a section line V-V in FIG. 4.

FIG. 5 is a cross-sectional view taken along a section line V-V in FIG. 4. Referring to FIGS. 4 and 5, the semiconductor device includes six P-type impurity regions PI1 to PI6 arranged one-dimensionally on a main surface side of a P-type semiconductor substrate PSUB, and gate electrodes G1 to G5, each of which is provided individually in each region between the adjacent impurity regions when the main surface is seen in a plan view. Impurity regions PI1 to PI6 are provided in an N-type well NW2 formed on the main surface side of P-type semiconductor substrate PSUB. Gate electrodes G1 to G5 are stacked on channel regions PC1 to PC5 of semiconductor substrate PSUB, respectively, with a gate insulating film (not shown) interposed therebetween. Impurity regions PI1 to PI6 and channel regions PC1 to PC6 as a whole are referred to as an active region AR2. A shallow trench isolation STI is formed around active region AR2. Hereinafter, impurity regions PI1 to PI6 and channel regions PC1 to PC5 are referred to as impurity region PI and channel region PC, respectively, when they are collectively referred or when an unspecified one is indicated.

Each gate electrode G and two adjacent impurity regions PI form the PMOS transistor. In other words, the two impurity regions adjacent to each gate electrode G form a pair of conductive electrodes of the PMOS transistor. Specifically, gate electrode G3 and adjacent impurity regions PI3 and PI4 form PMOS transistor MP1. Gate electrode G4 and adjacent impurity regions PI4 and PI5 form dummy transistor MPD1. Gate electrode G5 and adjacent impurity regions PI5 and PI6 form dummy transistor MPD2. Gate electrode G2 and adjacent impurity regions PI2 and PI3 form dummy transistor MPD3. Gate electrode G1 and adjacent impurity regions PI1 and PI2 form dummy transistor MPD4.

In PMOS transistor MP1, gate electrode G3 is connected to an upper-layer metal line (not shown) for supplying a gate voltage Vg through a contact hole formed in an interlayer insulating layer ID. Impurity region PI3 is connected to an upper-layer metal line (not shown) for supplying a source voltage Vs through a contact hole C2 formed in interlayer insulating layer ID. Impurity region PI4 is connected to an upper-layer metal line (not shown) for supplying a drain voltage Vd through a contact hole C3 formed in interlayer insulating layer ID. A current flowing through PMOS transistor WW1 changes in accordance with these gate voltage Vg, source voltage Vs and drain voltage Vd. In other words, in accordance with gate voltage Vg applied to gate electrode G3, conduction occurs between impurity regions PI3 and PI4.

In dummy transistors MPD1 to MPD4, gate electrodes G1, G2, G4, and G5 are formed integrally and thereby interconnected. These gate electrodes G1, G2, G4, and G5 are connected to an upper-layer metal line (not shown) for supplying a power supply voltage VDD through a contact hole formed in interlayer insulating layer ID. As a result, dummy transistors MPD1 to MPD4 are turned off. Gate electrodes G1, G2, G4, and G5 do not necessarily need to be formed integrally. Gate electrodes G1, G2, G4, and G5 may be separated from one another and formed of a polysilicon layer, and each gate electrode may be connected individually to the upper-layer metal line for supplying power supply voltage VDD.

Of impurity regions PI1 to PI6 arranged one-dimensionally, impurity regions PI1 and PI6 located at opposing ends are connected to the upper-layer metal line for supplying power supply voltage VDD through contact holes C1 and C4 formed in interlayer insulating layer ID, respectively. In other words, impurity regions PI1 and PI6 located at the opposing ends of the one-dimensional arrangement are configured to be electrically connected to gate electrodes G1, G2, G4, and G5 constantly. Power supply voltage VDD is applied to these impurity regions PI1 and PI6 as well as gate electrodes G1, G2, G4, and G5. Since each of impurity regions PI2 and PI5 is not connected to any upper-layer metal lines and power supply voltage VDD is constantly applied to the gate electrodes adjacent to both sides thereof, each of impurity regions PI2 and PI5 is maintained in a floating state.

Figure 6:
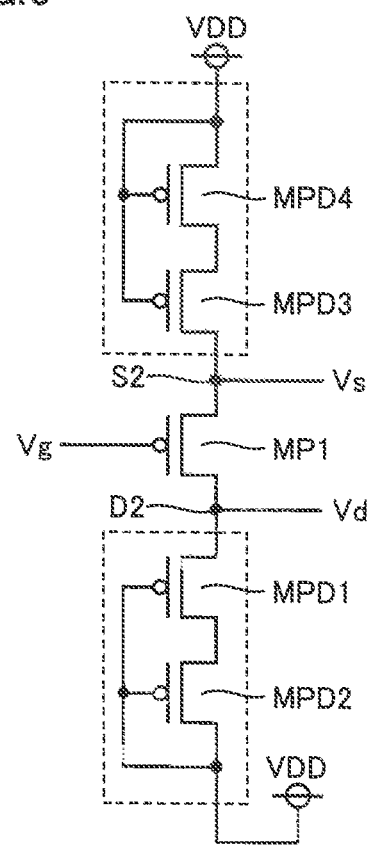
FIG. 6 is an equivalent circuit diagram corresponding to FIG. 4.

FIG. 6 is an equivalent circuit diagram corresponding to FIG. 4. In FIG. 6, transistors provided within the broken lines are the dummy transistors. As shown in FIG. 6, dummy transistors MPD1 and MPD2 are serially provided between a drain terminal D1 (corresponding to impurity region PI4 in FIG. 4) of PMOS transistor MP1 and a power supply node (corresponding to impurity region PI6 in FIG. 4) that receives power supply voltage VDD. Dummy transistors MPD3 and MPD4 are serially provided between a source terminal S1 (corresponding to impurity region PI3 in FIG. 4) of PMOS transistor MP1 and a power supply node (corresponding to impurity region PI1 in FIG. 4). The gate electrodes of dummy transistors MPD1, MPD2, MPD3, and MPD4 are connected to the power supply nodes.

The effects of the above-described semiconductor device are similar to those of the NMOS transistor described with reference to FIGS. 1 to 3. Specifically, by providing two serially-connected dummy transistors MPD1 and MPD2 as well as two serially-connected dummy transistors MPD3 and MPD4, the influence of the STI stress on the properties of PMOS transistor MP1 can be reduced and the off-leakage current flowing through the dummy transistors can be reduced. The number of serially-connected dummy transistors may be further increased.

Furthermore, according to the above-described semiconductor device, the shape nonuniformity caused by the manufacturing process can be suppressed. Referring to FIG. 4, in order to suppress the shape nonuniformity, it is desirable that gate lengths Lg1 to Lg5 of gate electrodes G1 to G5 be all equal, and it is desirable that lengths Lpi2 to Lpi5 of impurity regions PI2 to PI5 in the gate length direction be all equal.

[Example of Application to Differential Amplifier]

Figure 7:
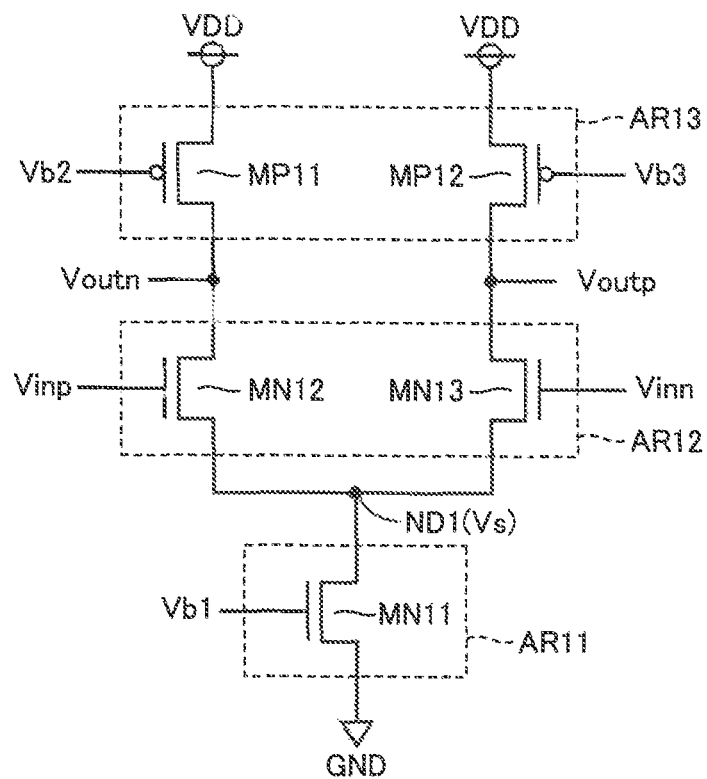
FIG. 7 is a circuit diagram showing a basic configuration of a differential amplifier as one example of a semiconductor device according to a first embodiment of the present invention.

FIG. 7 is a circuit diagram showing a basic configuration of a differential amplifier as one example of a semiconductor device according to a first embodiment of the present invention.

Referring to FIG. 7, the differential amplifier includes NMOS transistors MN12 and MN13 forming a differential pair, PMOS transistors MP11 and MP12 used as load transistors for NMOS transistors MN12 and MN13, respectively, and an NMOS transistor MN11 used as a current source.

PMOS transistor MP11 and NMOS transistor MN12 are serially connected in this order between a power supply node to which power supply voltage VDD is supplied and a connection node ND1. PMOS transistor MP12 and NMOS transistor MN13 are serially connected in this order between a power supply node and connection node ND1. NMOS transistor MN11 is connected between connection node ND1 and a ground node to which ground voltage GND is supplied. Predetermined bias voltages Vb1, Vb2 and Vb3 are supplied to a gate electrode of NMOS transistor MN11 and gate electrodes of PMOS transistors MP11 and MP12, respectively. Differential signals (Vinp, Vinn) are inputted to gate electrodes of NMOS transistors MN12 and MN13 forming the differential pair. Amplified differential signals (Voutp, Voutn) are outputted from drains of these NMOS transistors MN13 and MN12. Resistor elements may be used instead of PMOS transistors MP11 and MP12.

In order to achieve the operation with low power consumption, it is desirable to set power supply voltage VDD to be as low as possible. Particularly when the differential amplifier in FIG. 7 is operated with a low power supply voltage, a margin of an overdrive voltage of NMOS transistor MN11 used as the current source must be ensured. In order to achieve this, threshold voltages of NMOS transistors MN12 and MN13 used as the differential pair are made to have a value lower than a normal value. A threshold voltage of NMOS transistor MN11 used as the current source is desirably made to have a normal value in order to reduce the off-leakage current during standby (i.e., when bias voltage Vb1 is set at ground voltage GND and NMOS transistor MN11 is turned off).

When the NMOS transistors having different threshold voltages are present as described above, it is difficult to fabricate the NMOS transistors having different threshold voltages in the same active region. Therefore, in layout design of the differential amplifier shown in FIG. 7, active region AR11 where NMOS transistor MN11 having a normal threshold voltage is formed is different from active region AR12 where NMOS transistors MN12 and MN13 having a threshold voltage lower than the normal threshold voltage are formed. Furthermore, active region AR13 where PMOS transistors MP11 and MP12 are formed is different from active regions AR11 and AR12 where the NMOS transistors are formed. These active regions AR11, AR12 and AR13 are formed on the same semiconductor substrate and isolated from one another by the shallow trench isolation. A specific layout example will be described hereinafter.

(Layout of NMOS Transistors MN12 and MN13)

Figure 8:
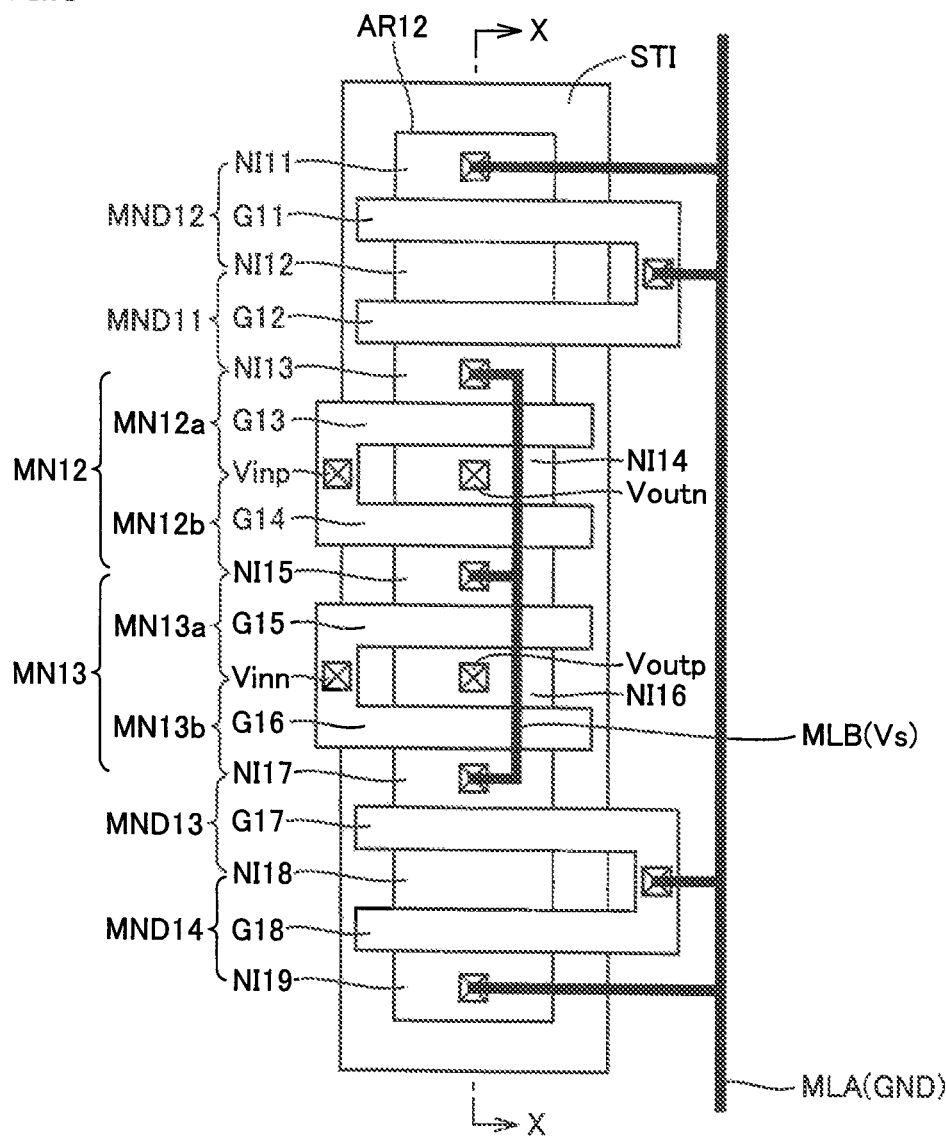
FIG. 8 is a plan view showing one layout example of NMOS transistors MN12 and MN13 formed in an active region AR12.

FIG. 8 is a plan view showing one layout example of NMOS transistors MN12 and MN13 formed in active region AR12.

Figure 9:
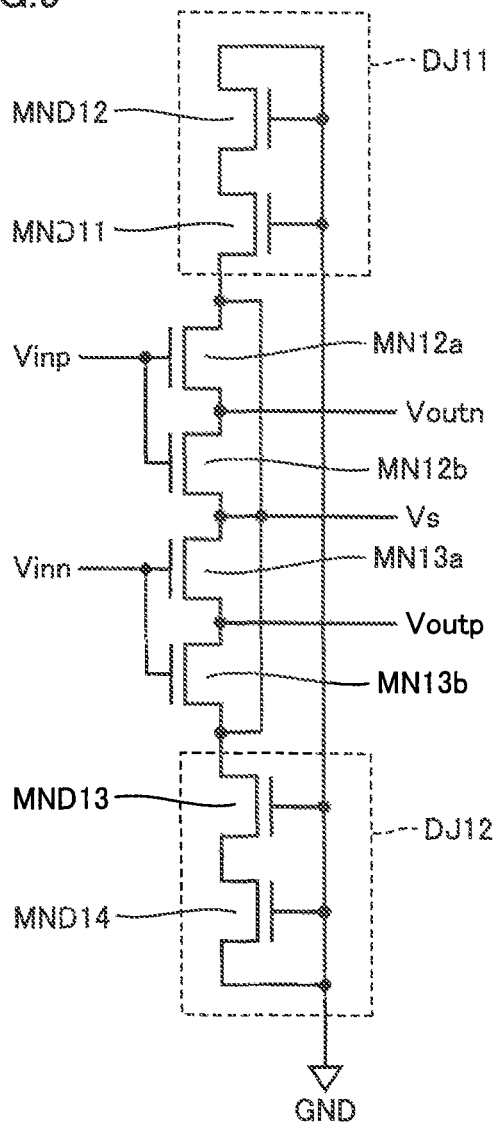
FIG. 9 is an equivalent circuit diagram corresponding to FIG. 8.

FIG. 9 is an equivalent circuit diagram corresponding to FIG. 8. Transistors provided within the broken lines in FIG. 9 are dummy transistors.

Figure 10:
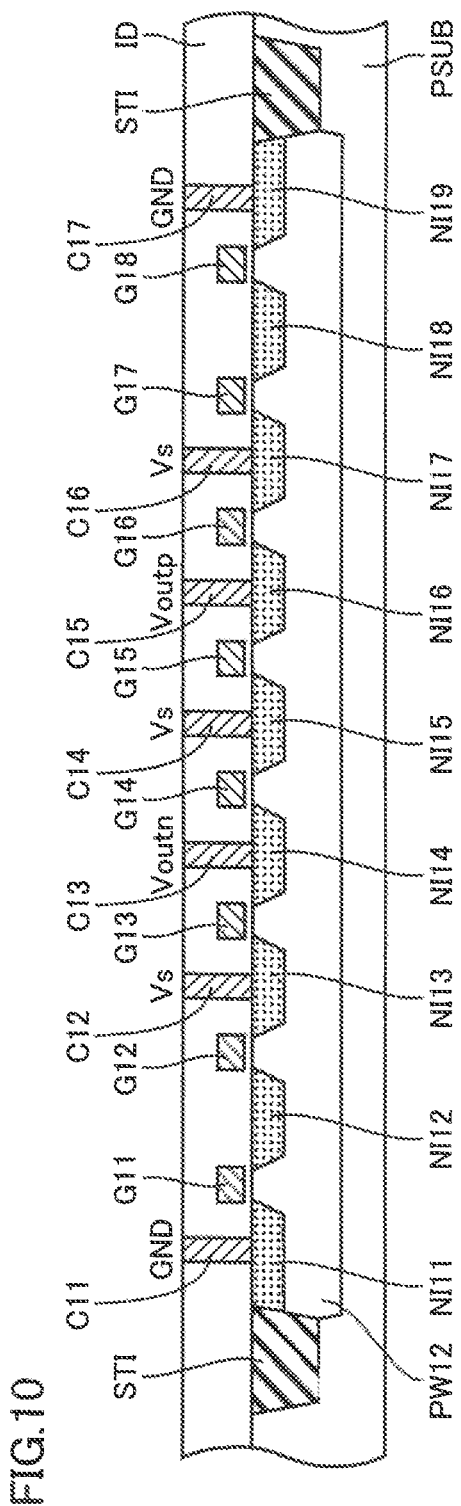
FIG. 10 is a cross-sectional view taken along a section line X-X in FIG. 8.

FIG. 10 is a cross-sectional view taken along a section line X-X in FIG. 8. In FIG. 10, metal lines MLA and MLB in FIG. 8 are not shown.

FIGS. 8 to 10 show an example in which each of NMOS transistors MN12 and MN13 in FIG. 7 is fabricated to have a two-finger gate structure. In the case of the two-finger gate structure, NMOS transistor MN12 in FIG. 7 is replaced with serial NMOS transistors MN12a and MN12b where gate electrodes G13 and G14 are interconnected, and NMOS transistor MN13 is replaced with serial NMOS transistors MN13a and MN13b where gate electrodes G15 and G16 are interconnected. These NMOS transistors MN12a and MN12b as well as NMOS transistors MN13a and MN13b are serially connected by sharing an impurity region NI15. Furthermore, two serially-connected dummy transistors are disposed at each end of these four serially-connected NMOS transistors MN12a, MN12b, MN13a, and MN13b, in order to suppress the STI stress and reduce the off-leakage current. Layout of NMOS transistors MN12a, MN12b, MN13a, and MN13b and dummy transistors MND11 to MND14 will be described in detail hereinafter.

Referring to FIGS. 8 and 10, active region AR12 includes nine N-type impurity regions NI11 to NI19 arranged one-dimensionally. Active region AR12 is formed in a P-type well PW12 provided in a semiconductor substrate PSUB. A shallow trench isolation STI is formed around active region AR12. Impurity regions NI11 to NI13 and gate electrodes G11 and G12, each of which is formed individually in each region between the adjacent impurity regions, form serially-connected dummy transistors MND12 and MND11. Impurity regions NI13 to NI17 and gate electrodes G13 to G16, each of which is formed individually in each region between the adjacent impurity regions, form four serially-connected NMOS transistors MN12a, MN12b, MN13a, and MN13b.

Impurity regions NI17 to NI19 and gate electrodes G17 and G18, each of which is formed individually in each region between the adjacent impurity regions, form two serially-connected dummy transistors MND13 and MND14.

Gate electrodes G11 and G12 are formed integrally and thereby interconnected, and are connected to upper-layer metal line MLA for supplying ground voltage GND through a contact hole formed in an interlayer insulating layer ID. Gate electrodes G17 and G18 are formed integrally and thereby interconnected, and are connected to upper-layer metal line MLA for supplying ground voltage GND through a contact hole formed in interlayer insulating layer ID. As a result, dummy transistors MND11 to MND14 are turned off. Gate electrodes G11 and G12 may be separated from each other and formed of a polysilicon layer, or gate electrodes G17 and G18 may be separated from each other and formed of a polysilicon layer. In this case, each of gate electrodes G11, G12, G17, and G18 is connected individually to upper-layer metal line MLA through the contact hole formed in interlayer insulating layer ID.

Gate electrodes G13 and G14 forming the two-finger gate are formed integrally and thereby interconnected, and are connected to an upper-layer metal line (not shown) for voltage signal Vinp through a contact hole formed in interlayer insulating layer ID. Similarly, gate electrodes G15 and G16 forming the two-finger gate are formed integrally and thereby interconnected, and are connected to an upper-layer metal line (not shown) for voltage signal Vinn through a contact hole formed in interlayer insulating layer ID. Gate electrodes G13 and G14 may be separated from each other and formed of a polysilicon layer, or gate electrodes G15 and G16 may be separated from each other and formed of a polysilicon layer. In this case, each of gate electrodes G13 and G14 is connected individually to the upper-layer metal line (not shown) for voltage signal Vinp. Similarly, each of gate electrodes G17 and G18 is connected individually to the upper-layer metal line (not shown) for voltage signal Vinn.

Impurity regions NM and NI19 located at opposing ends of the one-dimensional arrangement are connected to upper-layer metal line MLA for supplying ground voltage GND through contact holes C11 and C17 formed in interlayer insulating layer ID, respectively. In other words, impurity regions NI11 and NI19 located at the opposing ends of the one-dimensional arrangement are configured to be electrically connected to gate electrodes G11, G12, G17, and G18 constantly. Ground voltage GND is applied to these impurity regions NM and NI19 as well as gate electrodes G11, G12, G17, and G18. Since each of impurity regions NI12 and NI18 is not connected to any upper-layer metal lines and ground voltage GND is constantly applied to the gate electrodes adjacent to both sides thereof, each of impurity regions NI12 and NI18 is maintained in a floating state.

Impurity region NI14 is connected to an upper-layer metal line (not shown) for voltage signal Voutn through a contact hole C13 formed in interlayer insulating layer ID. Impurity region NI16 is connected to an upper-layer metal line (not shown) for voltage signal Voutp through a contact hole C15 formed in interlayer insulating layer ID.

Impurity regions NI13, NI15 and NI17 are connected to common upper-layer metal line MLB through contact holes C12, C14 and C16 formed in interlayer insulating layer ID, respectively. As a result, impurity regions NI13, NI15 and NI17 have the same voltage Vs. Impurity regions NI13, NI15 and NI17 are connected to an impurity region NI22 in FIG. 11 described below by metal line MLB. Impurity region NI22 is used as a conductive electrode of NMOS transistors MN11a and MN11b.

(Layout of NMOS Transistor MN11)

Figure 11:
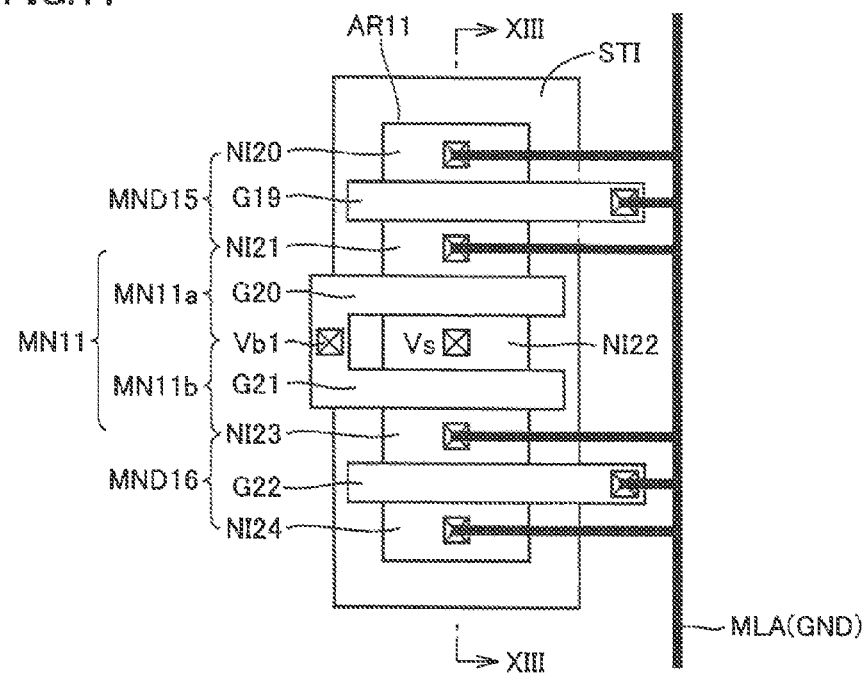
FIG. 11 is a plan view showing one layout example of an NMOS transistor MN11 formed in an active region AR11.

FIG. 11 is a plan view showing one layout example of NMOS transistor MN11 formed in active region AR11.

Figure 12:
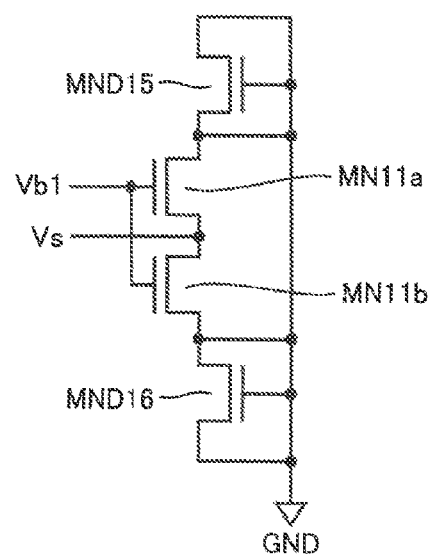
FIG. 12 is an equivalent circuit diagram corresponding to FIG. 11.

FIG. 12 is an equivalent circuit diagram corresponding to FIG. 11.

Figure 13:
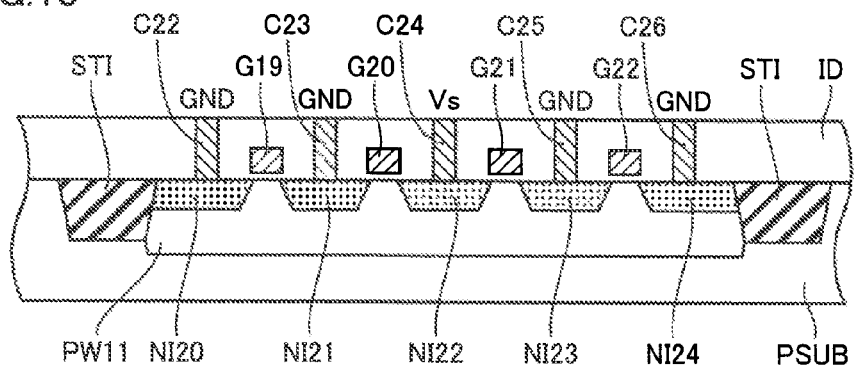
FIG. 13 is a cross-sectional view taken along a section line XIII-XIII in FIG. 11.

FIG. 13 is a cross-sectional view taken along a section line XIII-XIII in FIG. 11. In FIG. 13, metal line MLA in FIG. 11 is not shown.

FIGS. 11 to 13 show an example in which NMOS transistor MN11 in FIG. 7 is fabricated to have a two-finger gate structure. In the case of the two-finger gate structure, NMOS transistor MN11 in FIG. 7 is replaced with serial NMOS transistors MN11a and MN11b where gate electrodes G20 and G21 are interconnected. Dummy transistors MND15 and MND16 are disposed at each end of these two serially-connected NMOS transistors MN11a and MN11b, in order to suppress the STI stress. By employing the two-finger gate structure, the nodes at the opposing ends of serially-connected NMOS transistors MN11a and MN11b serve as ground nodes. Therefore, even without two or more serially-connected dummy transistors, the leakage current flowing through the dummy transistors does not become a problem. However, by serially providing two or more dummy transistors as described below with reference to FIG. 14, the influence of the STI stress is further reduced. Layout of NMOS transistors MN11a and MN11b and dummy transistors MND15 and MND16 shown in FIGS. 11 to 13 will be described in detail hereinafter.

Referring to FIGS. 11 and 13, active region AR11 includes five N-type impurity regions NI20 to NI24 arranged one-dimensionally. Active region AR11 is formed in a P-type well PW11 provided in semiconductor substrate PSUB. Shallow trench isolation STI is formed around active region AR11. Impurity regions NI20 and NI21 and a gate electrode G19 formed between these impurity regions form dummy transistor MND15. Impurity regions NI21 to NI23 and gate electrodes G20 and G21, each of which is formed individually in each region between the adjacent impurity regions, form serially-connected NMOS transistors MN11a and MN11b. Impurity regions NI23 and NI24 and a gate electrode G22 formed between these impurity regions form dummy transistor MND16.

Each of gate electrodes G19 and G22 is connected to upper-layer metal line MLA for supplying ground voltage GND through a contact hole formed in interlayer insulating layer ID. As a result, dummy transistors MND15 and MND16 are turned off.

Gate electrodes G20 and G21 forming the two-finger gate are formed integrally and thereby interconnected, and are connected to an upper-layer metal line (not shown) for supplying bias voltage Vb1 through a contact hole formed in interlayer insulating layer ID. Gate electrodes G20 and G21 may be separated from each other and formed of a polysilicon layer. In this case, each of gate electrodes G20 and G21 is connected individually to the upper-layer metal line (not shown) for supplying bias voltage Vb1.

Impurity regions NI20, NI21, NI23, and NI24 are connected to upper-layer metal line MLA for supplying ground voltage GND through contact holes C22, C23, C25, and C26 formed in interlayer insulating layer ID, respectively. Impurity region NI22 is connected to an upper-layer metal line (not shown) through a contact hole C24 formed in interlayer insulating layer ID, and thereby impurity region NI22 is electrically connected to impurity regions NI13, NI15 and NI17 shown in FIGS. 8 and 10. As a result, impurity region NI22 has the same voltage Vs as that of impurity regions NI13, NI15 and NI17 in FIGS. 8 and 10.

Figure 14:
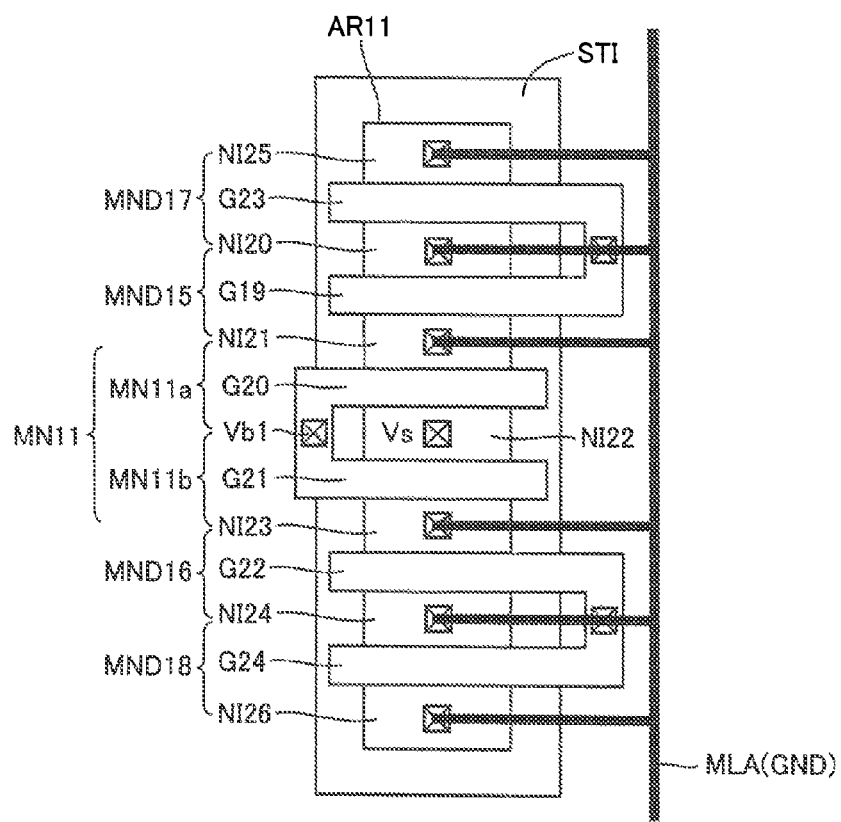
FIG. 14 is a plan view showing a modification of the layout shown in FIG. 11.

FIG. 14 is a plan view showing a modification of the layout shown in FIG. 11. The layout in FIG. 14 is different from the layout in FIG. 11 in that dummy transistors MND17 and MND18 are further provided. Dummy transistors MND17 and MND18 are serially connected to dummy transistors MND15 and MND16, respectively. As a result, the influence of the STI stress on NMOS transistors MN11a and MN11b can be further reduced.

Specifically, active region AR11 in FIG. 14 includes seven N-type impurity regions NI20 to NI26 arranged one-dimensionally. Each of gate electrodes G19 to G24 is disposed individually in each region between the adjacent impurity regions when the main surface of the semiconductor substrate is seen in a plan view. Disposition and connection of impurity regions NI20 to NI24 and gate electrodes G19 to G22 other than impurity regions NI25 and NI26 located at opposing ends of the one-dimensional arrangement are as described with reference to FIGS. 11 to 13, and thus, description will not be repeated.

Dummy transistor MND17 includes impurity region NI25 disposed at one end of the one-dimensional arrangement, impurity region NI20 provided adjacent to impurity region NI25, and gate electrode G23 provided between these impurity regions NI25 and NI20. Dummy transistor MND18 includes impurity region NI26 disposed at the other end of the one-dimensional arrangement, impurity region NI24 provided adjacent to impurity region NI26, and gate electrode G24 provided between these impurity regions NI26 and N124.

Each of impurity regions NI25 and NI26 is connected to upper-layer metal line MLA for supplying ground voltage GND through a contact hole formed in the interlayer insulating layer. Gate electrode G23 is formed integrally with gate electrode G19 and is connected to upper-layer metal line MLA through a contact hole formed in the interlayer insulating layer. Gate electrode G24 is formed integrally with gate electrode G22 and is connected to upper-layer metal line MLA through a contact hole formed in the interlayer insulating layer. Gate electrodes G19 and G23 may be separated from each other and formed of a polysilicon layer, or gate electrodes G22 and G24 may be separated from each other and formed of a polysilicon layer. When these gate electrodes are separated and formed individually, each gate electrode is connected individually to upper-layer metal line MLA.

(Layout of PMOS Transistors MP11 and MP12)

Figure 15:
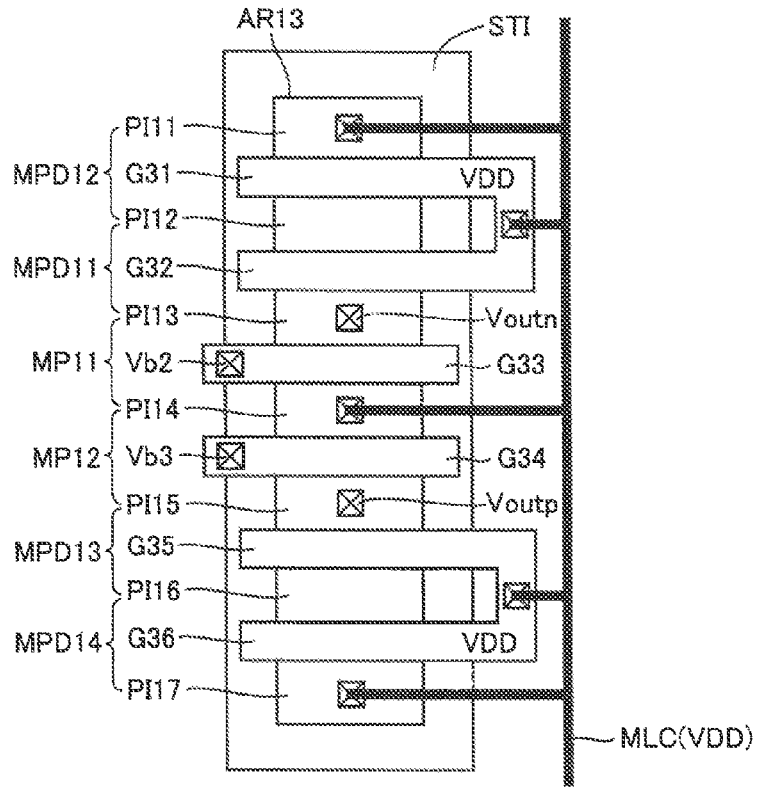
FIG. 15 is a plan view showing one layout example of PMOS transistors MP11 and MP12 formed in an active region AR13.

FIG. 15 is a plan view showing one layout example of PMOS transistors MP11 and MP12 formed in active region AR13. FIG. 15 shows an example in which each of PMOS transistors MP11 and MP12 in FIG. 7 is fabricated to have a one-finger gate structure. These PMOS transistors MP11 and MP12 are serially connected by sharing an impurity region PI14. Furthermore, two serially-connected dummy transistors are disposed at each of opposing ends of these two serially-connected PMOS transistors MP11 and MP12 in order to suppress the STI stress and reduce the off-leakage current. Layout of PMOS transistors MP11 and MP12 and dummy transistors MPD11 to MPD14 will be described in detail hereinafter.

As shown in FIG. 15, active region AR13 includes seven P-type impurity regions PI11 to PI17 arranged one-dimensionally. Active region AR13 is formed in an N-type well provided in semiconductor substrate PSUB. Shallow trench isolation STI is formed around active region AR13. Impurity regions PI11 to PI13 and gate electrodes G31 and G32, each of which is formed individually in each region between the adjacent impurity regions, form serially-connected dummy transistors MPD12 and MPD11. Impurity regions PI13 to PI15 and gate electrodes G33 and G34, each of which is formed individually in each region between the adjacent impurity regions, form serially-connected PMOS transistors MP11 and MP12. Impurity regions PI15 to PI17 and gate electrodes G35 and G36, each of which is formed individually in each region between the adjacent impurity regions, form serially-connected dummy transistors MPD13 and MPD14.

Gate electrodes G31 and G32 are formed integrally and thereby interconnected, and are connected to an upper-layer metal line MLC for supplying power supply voltage VDD through a contact hole formed in the interlayer insulating layer. Gate electrodes G35 and G36 are formed integrally and thereby interconnected, and are connected to upper-layer metal line MLC through a contact hole formed in the interlayer insulating layer. By fixing voltages of these gate electrodes G31, G32, G35, and G36 to power supply voltage VDD, dummy transistors MPD11 to MPD14 are constantly off. Gate electrodes G31 and G32 may be separated from each other and formed of a polysilicon layer, or gate electrodes G35 and G36 may be separated from each other and formed of a polysilicon layer. In this case, each of gate electrodes G31, G32, G35, and G36 is connected individually to upper-layer metal line MLC.

Gate electrodes G33 and G34 are connected to upper-layer metal lines (not shown) for supplying bias voltages Vb2 and Vb3 through contact holes formed in interlayer insulating layer ID, respectively.

Each of impurity regions PI11, PI14 and PI17 is connected to upper-layer metal line MLC for supplying power supply voltage VDD through a contact hole formed in the interlayer insulating layer. In other words, impurity regions PI11, PI14 and PI17 are configured to be electrically connected to gate electrodes G31, G32, G35, and G36 constantly, and power supply voltage VDD is constantly applied to impurity regions PI11, PI14 and PI17. Since each of impurity regions PI12 and PI16 is not connected to any upper-layer metal lines and power supply voltage VDD is constantly applied to the gate electrodes adjacent to both sides thereof, each of impurity regions PI12 and PI16 is maintained in a floating state.

Impurity region PI13 is connected to an upper-layer metal line (not shown) for voltage signal Voutn through a contact hole formed in the interlayer insulating layer. Impurity region PI15 is connected to an upper-layer metal line (not shown) for voltage signal Voutp through a contact hole formed in the interlayer insulating layer.

Figure 16:
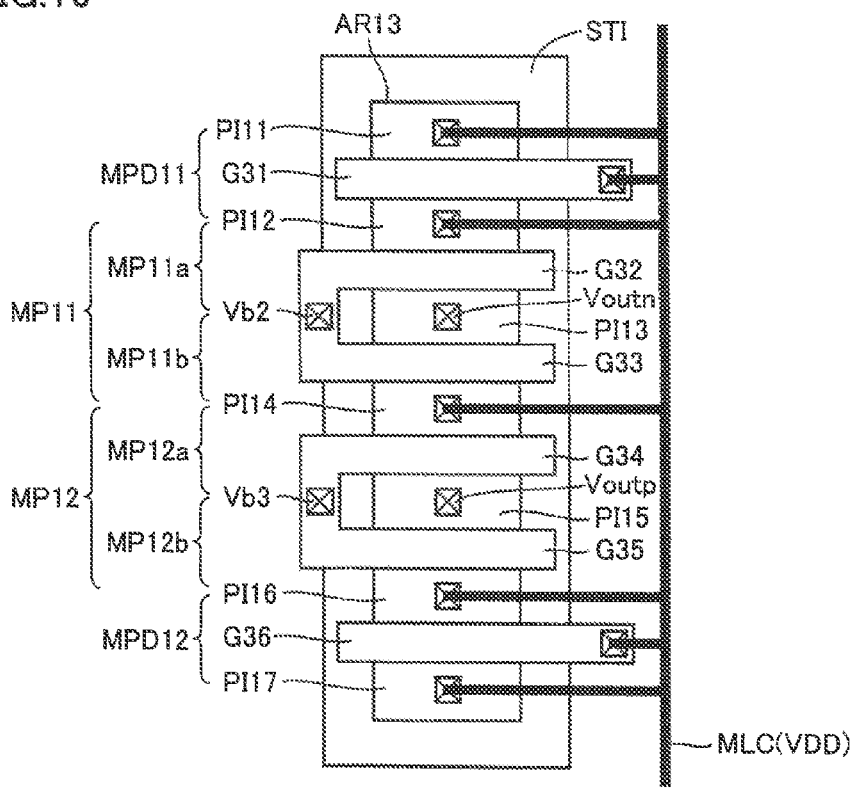
FIG. 16 is a plan view showing another layout example of PMOS transistors MP11 and MP12.

FIG. 16 is a plan view showing another layout example of PMOS transistors MP11 and MP12.

FIG. 16 shows an example in which each of PMOS transistors MP11 and MP12 in FIG. 7 is fabricated to have a two-finger gate structure. In the case of the two-finger gate structure, PMOS transistor MP11 in FIG. 7 is replaced with serial PMOS transistors MP11a and MP11b where gate electrodes G32 and G33 are interconnected. Similarly, PMOS transistor MP12 is replaced with serial PMOS transistors MP12a and MP12b where gate electrodes G34 and G35 are interconnected. These PMOS transistors MP11a and MP11b and PMOS transistors MP12a and MP12b are serially connected by sharing impurity region PI14. Dummy transistors MPD11 and MPD12 are disposed at opposing ends of these four serially-connected PMOS transistors MP11a, MP11b, MP12a, and MP12b in order to suppress the STI stress. By employing the two-finger gate structure, the nodes at the opposing ends of four serially-connected PMOS transistors MP11a, MP11b, MP12a, and MP12b serve as power supply nodes. Therefore, it is not necessary to serially connect the dummy transistors in order to reduce the off-leakage current.

Layout of PMOS transistors MP11a, MP11b, MP12a, and MP12b and dummy transistors MPD11 and MPD12 will be described in detail hereinafter.

Referring to FIG. 16, active region AR13 includes seven P-type impurity regions PI11 to PI17 arranged one-dimensionally. Active region AR13 is formed in the N-type well provided in semiconductor substrate PSUB. Shallow trench isolation STI is formed around active region AR13. Impurity regions PI11 and PI12 and gate electrode G31 formed between these impurity regions form dummy transistor MPD11. Impurity regions PI12 to PI16 and gate electrodes G32 to G35, each of which is formed individually in each region between the adjacent impurity regions, form four serially-connected PMOS transistors MP11a, MP11b, MP12a, and MP12b. Impurity regions PI16 and PI17 and gate electrode G36 formed between these impurity regions form dummy transistor MPD12.

Each of gate electrodes G31 and G36 is connected to upper-layer metal line MLC for supplying power supply voltage VDD through a contact hole formed in the interlayer insulating layer. As a result, dummy transistors MPD11 and MPD12 are turned off.

Gate electrodes G32 and G33 forming the two-finger gate are formed integrally and thereby interconnected, and are connected to the upper-layer metal line (not shown) for supplying bias voltage Vb2 through a contact hole formed in the interlayer insulating layer. Similarly, gate electrodes G34 and G35 forming the two-finger gate are formed integrally and thereby interconnected, and are connected to the upper-layer metal line (not shown) for supplying bias voltage Vb3 through a contact hole formed in interlayer insulating layer ID. Gate electrodes G32 and G33 may be separated from each other and formed of a polysilicon layer, or gate electrodes G34 and G35 may be separated from each other and formed of a polysilicon layer. In this case, each of gate electrodes G32 and G33 is connected individually to the upper-layer metal line (not shown) for supplying bias voltage Vb2, and each of gate electrodes G34 and G35 is connected individually to the upper-layer metal line (not shown) for supplying bias voltage Vb3.

Each of impurity regions PI11, PI12, PI14, PI16, and PI17 is connected to upper-layer metal line MLC for supplying power supply voltage VDD through a contact hole formed in interlayer insulating layer ID. Impurity region PI13 is connected to the upper-layer metal line (not shown) for voltage signal Voutn through a contact hole formed in interlayer insulating layer ID. Impurity region PI15 is connected to the upper-layer metal line (not shown) for voltage signal Voutp through a contact hole formed in interlayer insulating layer ID.

As already described with reference to FIG. 7, active region AR12 shown in FIG. 8, active region AR11 shown in FIGS. 11 and 14, and active region AR13 shown in FIGS. 15 and 16 are provided on the same semiconductor substrate PSUB and separated from one another by shallow trench isolation STI.

<Second Embodiment>

Figure 17:
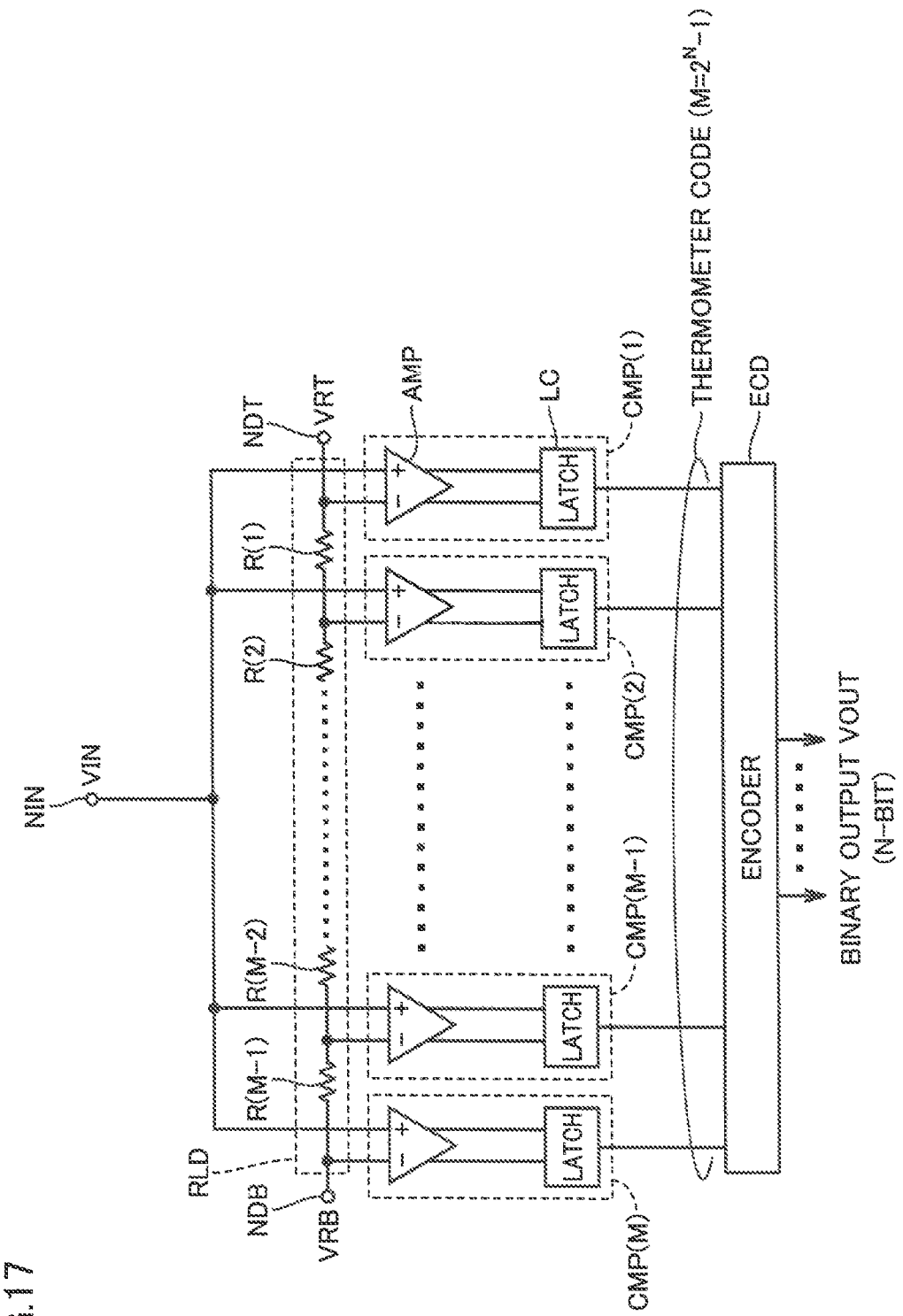
FIG. 17 is a block diagram showing a basic configuration of a flash-type AD converter as one example of a semiconductor device according to a second embodiment of the present invention.

FIG. 17 is a block diagram showing a basic configuration of a flash-type AD converter as one example of a semiconductor device according to a second embodiment of the present invention.

Referring to FIG. 17, the flash-type AD converter includes a resistor ladder RLD, comparators CMP(1) to CMP(M) of M in number, and an encoder ECD. The flash-type AD converter makes AD conversion of an analog signal VIN inputted to an input node NIN, thereby generating an N-bit binary output VOUT. In this case, M is equal to $2^N-1$.

Resistor ladder RLD includes serially-connected resistor elements R(1) to R(M−1) of M−1 in number. Reference potentials VRT and VRB (VRT>VRB) are applied to nodes NDT and NDB at opposing ends of these serially-connected resistor elements R(1) to R(M−1), respectively.

Each of comparators CMP(1) to CMP(M) of M in number includes a differential amplifier AMP and a latch circuit LC that holds a signal outputted from differential amplifier AMP. A non-inverted input terminal of each differential amplifier AMP is connected to input node NIN. An inverted input terminal of differential amplifier AMP provided in the first comparator CMP(1) is connected to node NDT. An inverted input terminal of differential amplifier AMP provided in the M-th comparator CMP(M) is connected to node NDB. An inverted input terminal of differential amplifier AMP provided in the i-th ($2 \leq i \leq M-1$) comparator CMP(i) is connected to a node connecting resistor element R(i−1) and resistor element R(i).

Encoder ECD receives data (thermometer code) outputted from comparators CMP(1) to CMP(M) and converts the data into N-bit binary data.

In the flash-type AD converter having the above-described configuration, the same configuration as that of the differential amplifier in the first embodiment described with reference to FIGS. 7 to 16 can be used for differential amplifier AMP provided in each of comparators CMP(1) to CMP(M). In this case, by linking MOS transistors having the same conductivity type and the same threshold voltage to form one active region, the layout area can be reduced. Layout of NMOS transistors MN12 and MN13 of low threshold voltage described with reference to FIG. 7 will be described hereinafter by way of example. In the following description, the same reference characters are given to the portions corresponding to the elements in FIGS. 8 to 10 and description will not be repeated. Parenthesized numeric characters at the end of the reference characters represent the number of comparator CMP.

Figure 18:
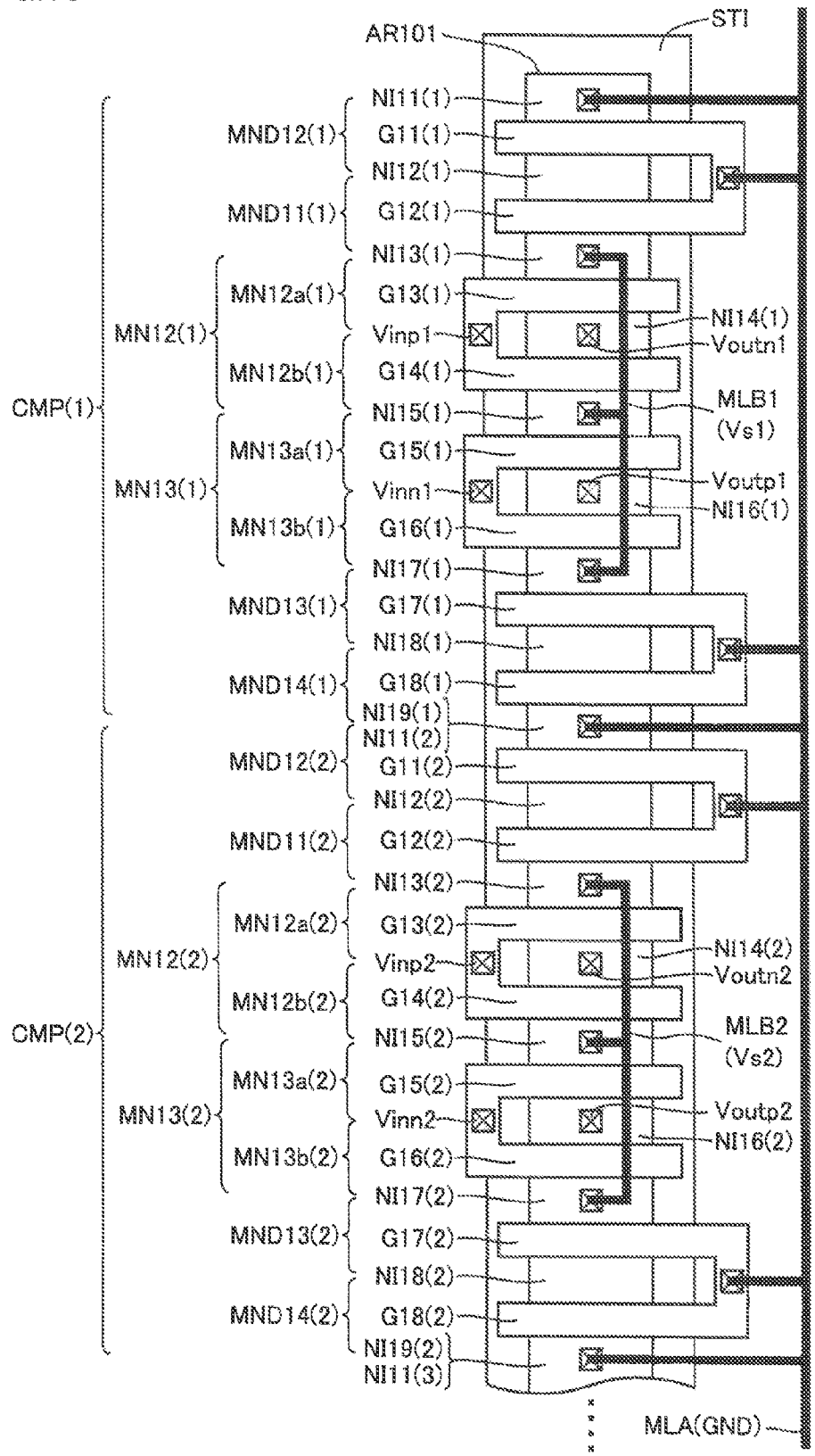
FIG. 18 is a plan view showing one layout example of NMOS transistors of low threshold voltage used in a differential amplifier AMP in FIG. 17.

FIG. 18 is a plan view showing one layout example of the NMOS transistors of low threshold voltage used in differential amplifier AMP in FIG. 17. NMOS transistors MN12a(1), MN12b(1), MN13a(1), and MN13b(1) as well as dummy transistors MND11(1), MND12(1), MND13(1), and MND14(1) in FIG. 18 are used in comparator CMP(1) in FIG. 17, and correspond to NMOS transistors MN12a, MN12b, MN13a, and MN13b as well as dummy transistors MND11, MND12, MND13, and MND14 in FIG. 8, respectively.

NMOS transistors MN12a(2), MN12b(2), MN13a(2), and MN13b(2) as well as dummy transistors MND11(2), MND12(2), MND13(2), and MND14(2) in FIG. 18 are used in comparator CMP(2) in FIG. 17, and correspond to NMOS transistors MN12a, MN12b, MN13a, and MN13b as well as dummy transistors MND11, MND12, MND13, and MND14 in FIG. 8, respectively. Dummy transistor MND14(1) and dummy transistor MND12(2) are linked by sharing impurity regions NI19(1) and NW (2).

Four serially-connected dummy transistors MND13(1), MND14(1), MND12(2), and MND11(2) are provided for element isolation between an impurity region NI17(1) involved in the operation of comparator CMP(1) and an impurity region NI13(2) involved in the operation of comparator CMP(2). Impurity regions NI19(1)/NI11(2) shared by dummy transistors MND14(1) and MND12(2) are connected to upper-layer metal line layer MLA through a contact hole formed in the interlayer insulating layer. As a result, ground voltage GND is applied to impurity regions NI19(1)/NI11(2).

In order to reduce the off-leakage current, two serially-connected dummy transistors are provided between these impurity regions NI19(1)/NI11(2) and impurity region NI17(1) as well as between impurity regions NI19(1)/NI11(2) and impurity region NI13(2). In other words, an impurity region NI18(1), impurity region NI11(2) (NI19(1)) and an impurity region NI12(2) are provided in this order between impurity region NI17(1) included in comparator CMP(1) and impurity region NI13(2) included in comparator CMP(2).

Impurity region NI18(1) is not connected to any upper-layer metal line layers. Moreover, gate electrodes G17(1) and G18(1) provided adjacent to both sides of impurity region NI18(1) are connected to metal line layer MLA, and thereby gate electrodes G17(1) and G18(1) are constantly connected to impurity region NI11(2) and constantly receive ground voltage GND. Therefore, impurity region NI18(1) is maintained in a floating state. Similarly, impurity region NI12(2) is not connected to any upper-layer metal line layers. Moreover, gate electrodes G11(2) and G12(2) provided adjacent to both sides of impurity region NI12(2) are connected to metal line layer MLA, and thereby gate electrodes G11(2) and G12(2) are constantly connected to impurity region NI11(2) and constantly receive ground voltage GND. Therefore, impurity region NI12(2) is maintained in a floating state.

In order to achieve element isolation and reduce the off-leakage current with more reliability, the number of serially-connected dummy transistors may be increased.

In order not to produce the shape nonuniformity caused by the manufacturing process, it is desirable that gate lengths of dummy transistors MND13(1), MND14(1), MND12(2), and MND11(2) be equal to gate lengths of MOS transistors MN13$b$(1) and MN12$a$(2) involved in the circuit operation. In other words, gate lengths of gate electrodes G16(1), G17(1), G18(1), G11(2), and G12(2) are equal to one another. Furthermore, it is desirable that lengths, in the gate length direction (arrangement direction of the impurity regions), of impurity regions NI17(1), NI18(1), NI11(2) (NI19(1)), NI12(2), and NI13(2) forming dummy transistors MND13(1), MND14(1), MND12(2), and MND11(2) be all equal.

The NMOS transistors of low threshold voltage used in remaining comparators CMP(3) to CMP(M) in FIG. 17 are laid out similarly to the above. An active region AR101 includes impurity regions forming the NMOS transistors of low threshold voltage provided for all of these comparators CMP(1) to CMP(M). Shallow trench isolation STI is formed around active region AR101.

Figure 19:
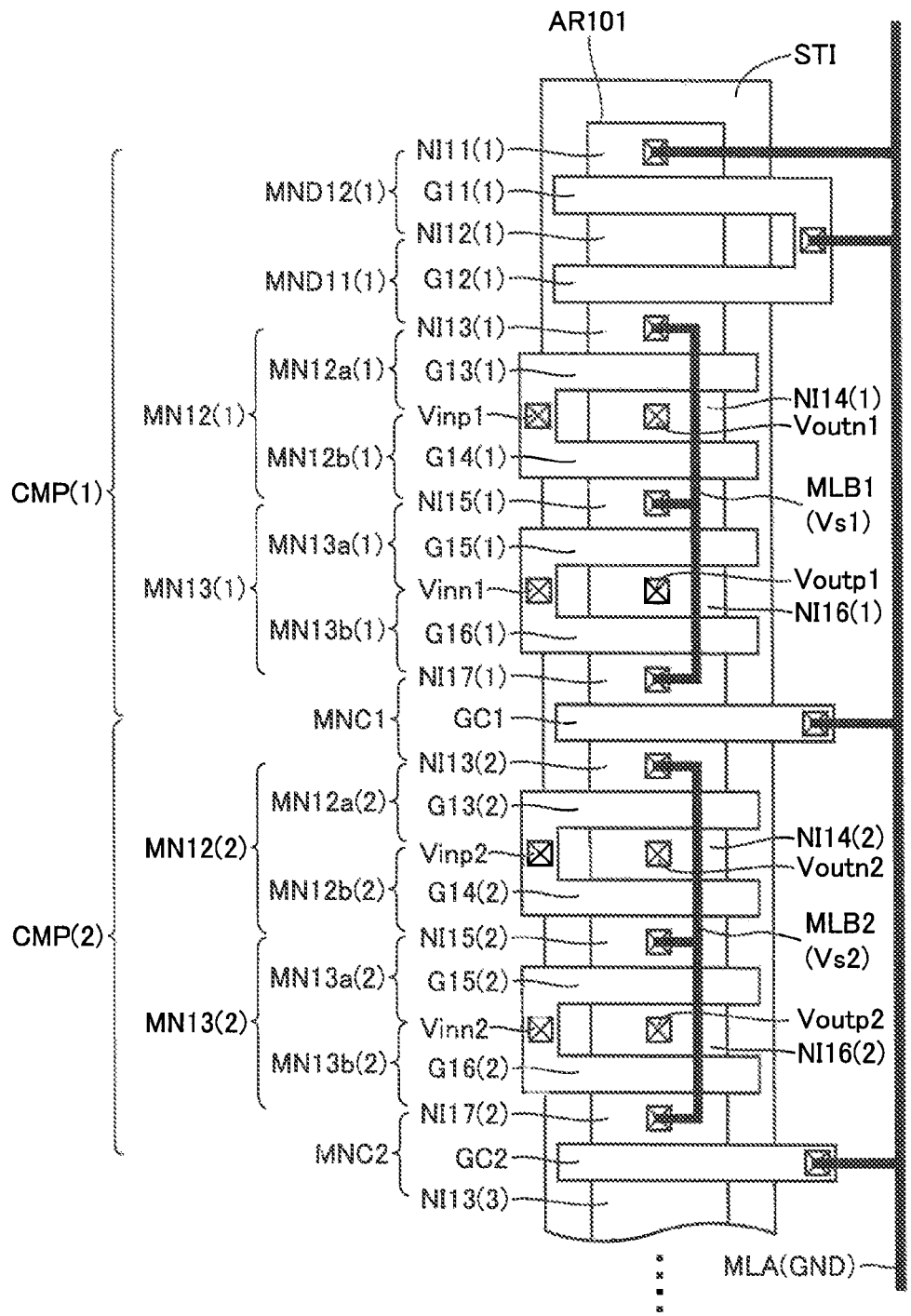
FIG. 19 is a plan view showing another layout example of the NMOS transistors of low threshold voltage used in differential amplifier AMP in FIG. 17.

FIG. 19 is a plan view showing another layout example of the NMOS transistors of low threshold voltage used in differential amplifier AMP in FIG. 17. In the layout example shown in FIG. 19, one dummy transistor MNC1 is provided instead of dummy transistors MND13(1), MND14(1), MND12(2), and MND11(2) in FIG. 18. Dummy transistor MNC1 includes a gate electrode GC1 and impurity regions NI17(1) and NI13(2). Gate electrode GC1 is connected to upper-layer metal line MLA through a contact hole formed in the interlayer insulating layer, and thereby ground voltage GND is applied to gate electrode GC1. As a result, dummy transistor MNC1 is turned off. In the case of the layout in FIG. 19, only one dummy transistor is provided between impurity region NI17(1) involved in the operation of comparator CMP(1) and impurity region NI13(2) involved in the operation of comparator CMP(2), and thus, these impurity regions N117(1) and N113(2) may be capacitively coupled. Therefore, insulating isolation is insufficient as compared with the layout shown in FIG. 18.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

Reference Signs List

AR active region; G gate electrode; GND ground voltage; ID interlayer insulating layer; MN NMOS transistor; MP PMOS transistor; NI N-type impurity region; PI P-type impurity region; MND N-type dummy transistor; MPD P-type dummy transistor; NC, PC channel region; NW2 N-type well; PSUB P-type semiconductor substrate; PW1, PW11, PW12 P-type well; STI shallow trench isolation; VDD power supply voltage.

The invention claimed is:

1. A semiconductor device, comprising:
   an active region formed on a main surface of a semiconductor substrate and including a plurality of impurity regions of the same conductivity type arranged one-dimensionally; and
   a plurality of gate electrodes, each of which is provided individually in each region between two adjacent impurity regions of said plurality of impurity regions when the main surface of said semiconductor substrate is seen in a plan view, and each of which forms an insulated gate field effect transistor together with the two adjacent impurity regions,
   wherein said plurality of impurity regions include:
      a first impurity region to which a predetermined voltage is applied,
      second and third impurity regions forming a pair of conductive electrodes of an insulated gate field effect transistor,
      fourth and fifth impurity regions, one of which forms a source electrode of a different insulated gate field effect transistor, and the other of which forms a drain electrode of the different insulated gate field effect transistor, and
      at least one impurity region disposed between said first and fourth impurity regions,
   wherein a voltage that causes electrical conduction between said second and third impurity regions is applied to a gate electrode, disposed between said second and third impurity regions, of said plurality of gate electrodes,
   wherein a voltage that causes electrical conduction between said fourth and fifth impurity regions is applied to a gate electrode, disposed between said fourth and fifth impurity regions, of said plurality of gate electrodes,
   wherein all gate electrodes disposed between said first and fourth impurity regions, of said plurality of gate electrodes, are configured to be electrically connected to said first impurity region constantly, and
   wherein, by application of said predetermined voltage to all gate electrodes disposed between said first and fourth impurity regions, all impurity regions disposed between said first and fourth impurity regions, of said plurality of impurity regions, are electrically isolated from said first and fourth impurity regions and maintained in a floating state.

2. The semiconductor device according to claim 1, further comprising:
   a shallow trench isolation formed around said active region,
   wherein said first impurity region is located at an end of one-dimensional arrangement formed by said plurality of impurity regions.

3. The semiconductor device according to claim 2,
wherein a length of said second impurity region along an arrangement direction of said plurality of impurity regions is equal to a length, along said arrangement direction, of each of all impurity regions disposed between said first and second impurity regions, and
lengths, along said arrangement direction, of all gate electrodes disposed between said first impurity region and said third impurity region when the main surface of said semiconductor substrate is seen in a plan view are equal to one another.

4. The semiconductor device according to claim 1,
wherein a length of said second impurity region along an arrangement direction of said plurality of impurity regions, a length of said fourth impurity region along said arrangement direction, and a length, along said arrangement direction, of each impurity region disposed between said second and fourth impurity regions and including said first impurity region are equal to one another, and
lengths, along said arrangement direction, of all gate electrodes disposed between said third and fifth impurity regions are equal to one another.

5. The semiconductor device according to claim 1,
wherein said second impurity region is connected to an insulated gate field effect transistor different from the insulated gate field effect transistor formed by said second and third impurity regions.

6. The semiconductor device according to claim 5,
wherein said plurality of impurity regions further include a fourth impurity region electrically connected to said second impurity region and forming one of a pair of conductive electrodes of said different insulated gate field effect transistor.

7. The semiconductor device according to claim 6,
wherein said third impurity region forms the other conductive electrode of said different insulated gate field effect transistor.

8. A semiconductor device, comprising:
an active region formed on a main surface of a semiconductor substrate and including a plurality of impurity regions of the same conductivity type arranged one-dimensionally;
a plurality of gate electrodes, each of which is provided individually in each region between two adjacent impurity regions of said plurality of impurity regions when the main surface of said semiconductor substrate is seen in a plan view, and each of which forms an insulated gate field effect transistor together with the two adjacent impurity regions; and
a different active region formed on the main surface of said semiconductor substrate, including a plurality of impurity regions of the same conductivity type arranged one-dimensionally, and isolated from said active region by a shallow trench isolation,
wherein said plurality of impurity regions include:
a first impurity region to which a predetermined voltage is applied,
second and third impurity regions forming a pair of conductive electrodes of an insulated gate field effect transistor, and
at least one impurity region disposed between said first and second impurity regions,
wherein a voltage that causes electrical conduction between said second and third impurity regions is applied to a gate electrode, disposed between said second and third impurity regions, of said plurality of gate electrodes,
wherein all gate electrodes disposed between said first and second impurity regions, of said plurality of gate electrodes, are configured to be electrically connected to said first impurity region constantly,
wherein by application of said predetermined voltage to all gate electrodes disposed between said first and second impurity regions, all impurity regions disposed between said first and second impurity regions, of said plurality of impurity regions, are electrically isolated from said first and second impurity regions and maintained in a floating state,
wherein said second impurity region is connected to an insulated gate field effect transistor different from the insulated gate field effect transistor formed by said second and third impurity regions, and
wherein said plurality of impurity regions of said different active region include a fourth impurity region electrically connected to said second impurity region and forming one of a pair of conductive electrodes of said different insulated gate field effect transistor.

* * * * *